(12) United States Patent
Daikuhara et al.

(10) Patent No.: US 8,288,661 B2
(45) Date of Patent: *Oct. 16, 2012

(54) PRINTED CIRCUIT BOARD AND MANUFACTURING METHOD THEREFOR

(75) Inventors: Osamu Daikuhara, Shinagawa (JP);
Toshihiro Kusagaya, Shinagawa (JP);
Toru Yamakami, Shinagawa (JP);
Takahiro Kondou, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 292 days.

This patent is subject to a terminal disclaimer.

(21) Appl. No.: 12/617,191

(22) Filed: Nov. 12, 2009

(65) Prior Publication Data

US 2010/0051336 A1    Mar. 4, 2010

Related U.S. Application Data

(62) Division of application No. 11/487,979, filed on Jul. 18, 2006, now Pat. No. 7,638,715.

(30) Foreign Application Priority Data

Jul. 22, 2005  (JP) ................................. 2005-212427

(51) Int. Cl.
*H05K 1/11* (2006.01)
(52) U.S. Cl. ........................................ 174/261; 361/767
(58) Field of Classification Search .................. 174/257, 174/260, 261; 361/760, 761, 767, 782, 728–737, 361/808–811; 439/70, 71, 77, 67, 65; 29/846, 29/852, 825

See application file for complete search history.

(56) References Cited

U.S. PATENT DOCUMENTS

| | | | |
|---|---|---|---|
| 4,560,962 A | 12/1985 | Barrow | |
| 4,743,710 A | 5/1988 | Shiebar et al. | |
| 4,764,644 A | 8/1988 | Reisman et al. | |
| 4,791,722 A | 12/1988 | Miller | |
| 4,851,614 A | 7/1989 | Duncan | |
| 4,859,806 A | 8/1989 | Smith | |
| 4,868,980 A | 9/1989 | Miller | |
| 5,432,677 A | 7/1995 | Mowatt et al. | |
| 5,905,640 A * | 5/1999 | Hutchison et al. | 361/783 |
| 6,479,765 B2 * | 11/2002 | Ramey et al. | 174/262 |
| 6,663,442 B1 * | 12/2003 | Helster et al. | 439/751 |
| 6,921,868 B2 | 7/2005 | Salmela et al. | |
| 7,020,960 B2 | 4/2006 | Nelson et al. | |
| 7,638,715 B2 * | 12/2009 | Daikuhara et al. | 174/260 |
| 8,064,216 B2 * | 11/2011 | Shibao | 361/763 |

FOREIGN PATENT DOCUMENTS

JP       63-213397       9/1988

(Continued)

OTHER PUBLICATIONS

Japanese Office Action issued Nov. 24, 2010 in corresponding Japanese Patent Application 2005-212427.

*Primary Examiner* — Yuriy Semenenko (74) *Attorney, Agent, or Firm* — Staas & Halsey LLP (57) ABSTRACT

A printed circuit board of a card edge connector type includes interconnections formed on a surface of a substrate to be electrically coupled to respective connecting terminals formed by electrolytic plating on an edge of the substrate, and connecting terminal-forming wirings being respectively in connection with the interconnections, when the connecting terminals are formed by the electrolytic plating. The interconnections are electrically isolated from the connecting terminal-forming wirings by process openings formed in the substrate.

10 Claims, 9 Drawing Sheets

FOREIGN PATENT DOCUMENTS

| | | | |
|---|---|---|---|
| JP | 03250691 | * | 9/1991 |
| JP | 3-250691 | | 11/1991 |
| JP | 5-37133 | | 2/1993 |
| JP | 2003-158381 | | 5/2003 |
| JP | 2003158381 | * | 5/2003 |
| JP | 2005-26020 | | 1/2005 |

* cited by examiner

FIG. 11B

PRINTED CIRCUIT BOARD AND MANUFACTURING METHOD THEREFOR

CROSS REFERENCE TO RELATED APPLICATIONS

This application is based on and hereby claims priority to U.S. patent application Ser. No. 11/487,979 filed on Jul. 18, 2006, now pending, the contents of which are hereby incorporated by reference.

BACKGROUND OF THE INVENTION

1. Field of the Invention

This invention generally relates to a printed circuit board of a card edge connector type and a manufacturing method therefor.

2. Description of the Related Art

A card edge connector type of printed circuit board is known, as disclosed, for example, in Japanese Patent application Publication No. 2005-26020. This printed circuit board of the card edge connector type includes multiple connecting terminals formed on one end of the printed circuit board, and is inserted into or pulled out of a corresponding connector. The above-described card edge connector type of printed circuit board is configured in such a manner that distances from a card edge to the connecting terminals are selectively varied in order to adjust touch timings between the respective connecting terminals and corresponding contacts on the connector, when a card edge portion is inserted into the connector.

In a case where the above-described connecting terminals that can adjust the touch timings with the connector are formed by electrolytic gold plating, connecting terminal-forming wirings are needed for forming the connecting terminals. However, when the connecting terminal-forming wirings are arranged between the card edge and the connecting terminals, there is the possibility that the function of adjusting the touch timings cannot be assured. Accordingly, the connecting terminal-forming wirings have to be coupled respectively to the connecting terminals through signal lines connected to the connecting terminals.

Meanwhile, if the circuit is operated with the connecting terminal-forming wirings respectively coupled to the signal lines, this causes impedance mismatching or signal transmission loss. In particular, in a case where the connecting terminal-forming wirings are connected to the signal lines that transmits high-speed signals of as high as GHz band.

SUMMARY OF THE INVENTION

The present invention has been made in view of the above circumstances and provides a printed circuit board and a manufacturing method therefor, in which it is possible to eliminate the influence on the circuit characteristics of connecting terminal-forming wirings respectively connected to signal lines or the like so as to form connecting terminals by electrolytic plating on a printed circuit board of a card edge connector type.

According to one aspect of the present invention, there is provided a printed circuit board of a card edge connector type including: interconnections formed on a surface of a substrate to be electrically coupled to respective connecting terminals formed by electrolytic plating on an edge of the substrate; and connecting terminal-forming wirings being respectively in connection with the interconnections, when the connecting terminals are formed by the electrolytic plating. The interconnections are electrically isolated from the connecting terminal-forming wirings by process openings formed in the substrate. With the above-described configuration, the process openings are formed after the interconnections and the connecting-terminal forming wirings are respectively coupled. Thus, the interconnections and the connecting-terminal forming wirings can be isolated electrically, thereby eliminating the influence on the circuit characteristics of the connecting terminal-forming wirings with ease.

According to another aspect of the present invention, there is provided a printed circuit board of a card edge connector type including: two interconnections formed in parallel on a surface of a substrate to be electrically coupled to respective connecting terminals formed by electrolytic plating on an edge of the substrate; and a connecting terminal-forming wiring being commonly in connection with the two interconnections, when the connecting terminals are formed by the electrolytic plating. The two interconnections are electrically isolated from the connecting terminal-forming wiring by a process opening formed in the substrate, the process opening being commonly connected to the two interconnections. With the above-described configuration, the connecting terminal-forming wiring can be commonly provided to the two interconnections.

According to still another aspect of the present invention, there is provided a manufacturing method of a printed circuit board of a card edge connector type including: forming interconnections and connecting terminal-forming wirings by electrolytic plating before connecting terminals are formed by electrolytic plating on an edge of a substrate, so that the interconnections are respectively connected to connecting terminals and the connecting terminal-forming wirings are respectively connected to the interconnections; and forming process openings in the substrate to electrically isolate the interconnections from the connecting terminal-forming wirings.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1A:
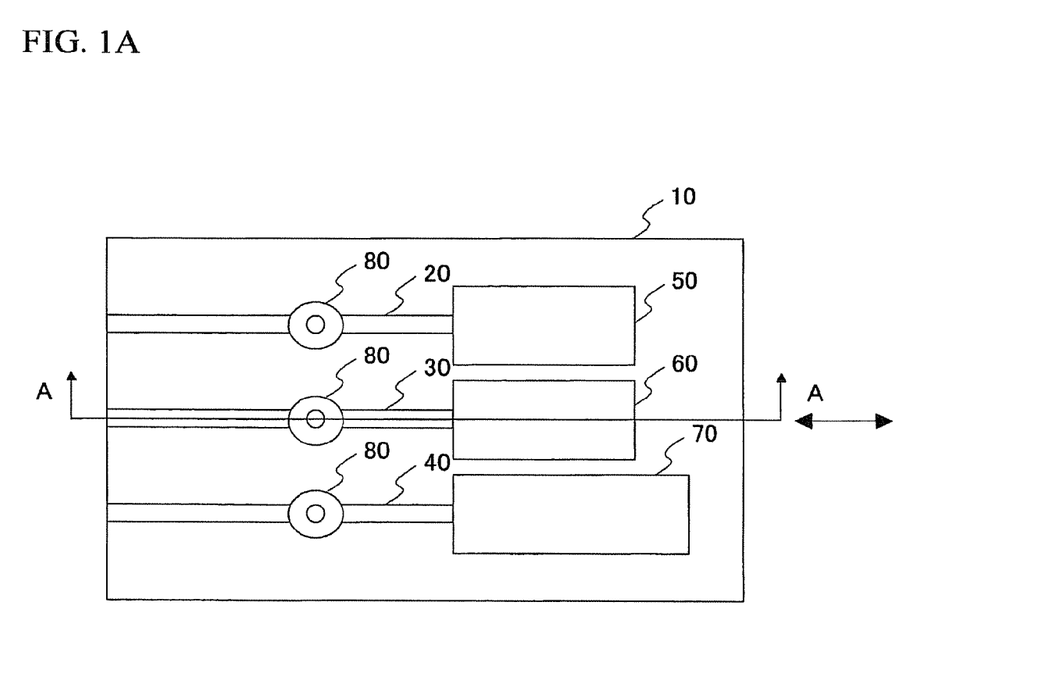
FIG. 1A is a top view illustrating a configuration of a printer circuit board in accordance with an exemplary embodiment of the present invention.
Figure 1B:
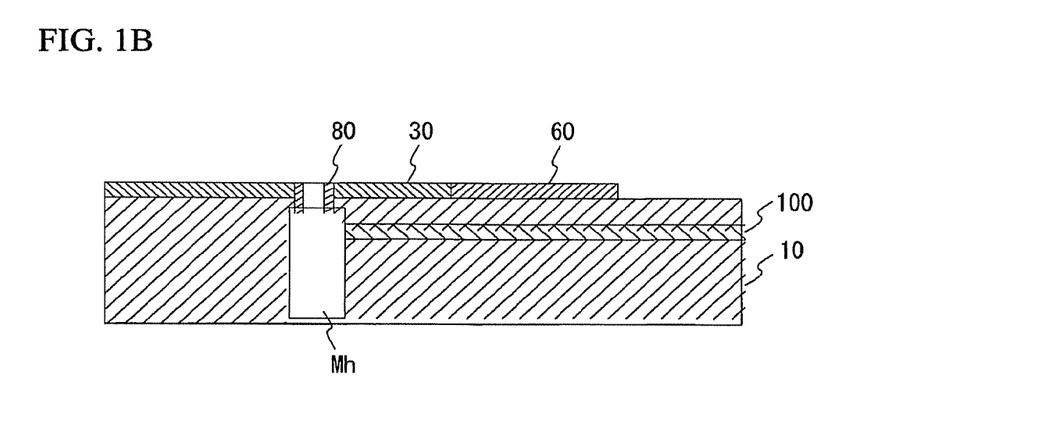
FIG. 1B is a cross-sectional view taken along a line A-A shown in FIG. 1A.
Figure 2:
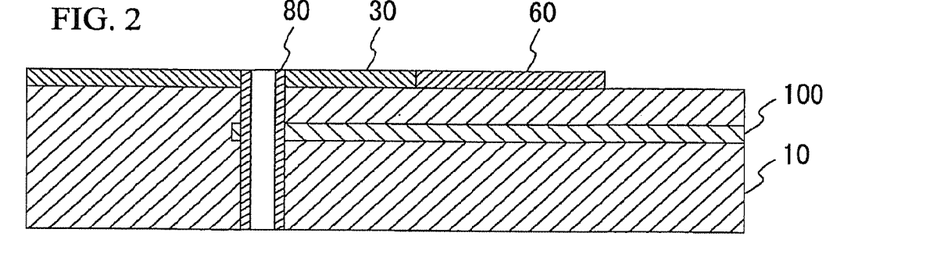
FIG. 2 is a cross-sectional view showing a state before process openings are formed on the printed circuit board.

FIG. 1A, FIG. 1B, and FIG. 2 illustrate an exemplary embodiment of the present invention. FIG. 1A is a top view illustrating a configuration of a printed circuit board. FIG. 1B is a cross-sectional view taken along a line A-A shown in FIG. 1A. FIG. 2 is a cross-sectional view showing a state before process openings are formed on the printed circuit board. Referring to FIG. 1A and FIG. 1B, the printed circuit board is of a card edge connector type having multiple connecting terminals 50, 60, and 70 are formed on a surface of one edge of a multilayer substrate 10 (hereinafter, simply referred to as substrate 10), by electrolytic gold plating. The substrate 10 is made of a dielectric material such as an epoxy resin or the like. The printed circuit board is inserted into or pulled out of a connector, not shown, in directions of two-headed arrows shown in FIG. 1A. At this time, the connecting terminals 50, 60, and 70 and the edge of the substrate 10 are provided in such a manner that the distance between the connecting terminals 50 and the edge is almost identical to that between the connecting terminal 60 and the edge, and the distance between the connecting terminal 70 and the edge is selectively longer than those between the terminal 50 or 60 and the edge.

Also, interconnections 20, 30, and 40 electrically coupled to the connecting terminals 50, 60, and 70 are formed of a conductive material such as copper or the like on a surface of the substrate 10 by a known technique. The interconnections 20, and 30 are lines provided for high-speed signals that transmit, for example, high-speed signals of as high as GHz band. The interconnection 40 is provided for a power supply, ground, or low-speed signals. Via hole platings 80 made of copper or the like are respectively formed to serve as via hole conductors and extend to given depths of the interconnections 20, 30, and 40, and are respectively connected to the interconnections 20, 30, and 40.

Connecting terminal-forming wirings 100 are provided as an inner layer of the substrate 10, as shown in FIG. 1B. The connecting terminal-forming wirings 100 are used with being connected to the interconnections 20, 30, and 40 respectively, while the connecting terminals 50, 60, and 70 are being formed by the electrolytic gold plating. The connecting terminal-forming wirings 100 are patterned, for example, by a conductive material such as copper or the like, and are respectively formed to correspond to the connecting terminals 50, 60, and 70. Process openings Mh are formed in positions that correspond to those for forming the via hole platings 80 so as to extend to given depths in the substrate 10 (in other words, so as not to pierce through the substrate 10) and electrically isolate the corresponding interconnections 20, 30, and 40 from the connecting terminal-forming wirings 100.

On the printer circuit board before the process openings Mh are formed, the via hole plating 80 is electrically coupled with the connecting terminal-forming wiring 100, as shown in FIG. 2. The printer circuit board of FIG. 2 is formed by a known technique. The connecting terminal-forming wirings 100, the interconnections 20, 30, and 40, and the via hole platings 80 are formed, and the connecting terminals 50, 60, and 70 are then formed by the electrolytic gold plating with the use of the connecting terminal-forming wirings 100. Here, the connecting terminal-forming wirings 100, the interconnections 20, 30, and 40, and the via hole platings 80 are electrically coupled to respectively establish electrical connection paths so as to provide the connecting terminals 50, 60, and 70.

Then, the connecting terminals 50, 60, and 70 are formed by a known technique of the electrolytic gold plating. Subsequently, the process opening Mh is processed to a given depth of the substrate 10 in the position that corresponds to the position where the via hole plating 80 is formed, from the backside of the substrate 10 by use of a process machine equipped with a drill, so the via hole plating 80 and the connecting terminal-forming wiring 100 are disconnected. As described heretofore, as shown in FIG. 1A and FIG. 1B, the connecting terminal-forming wirings 100 are electrically isolated from the interconnections 20, 30, and 40, thereby making it possible to prevent the impedance mismatching and signal transmission loss caused by unnecessary connections between the connecting terminal-forming wirings 100 and the interconnections 20, 30, and 40.

Figure 3A:
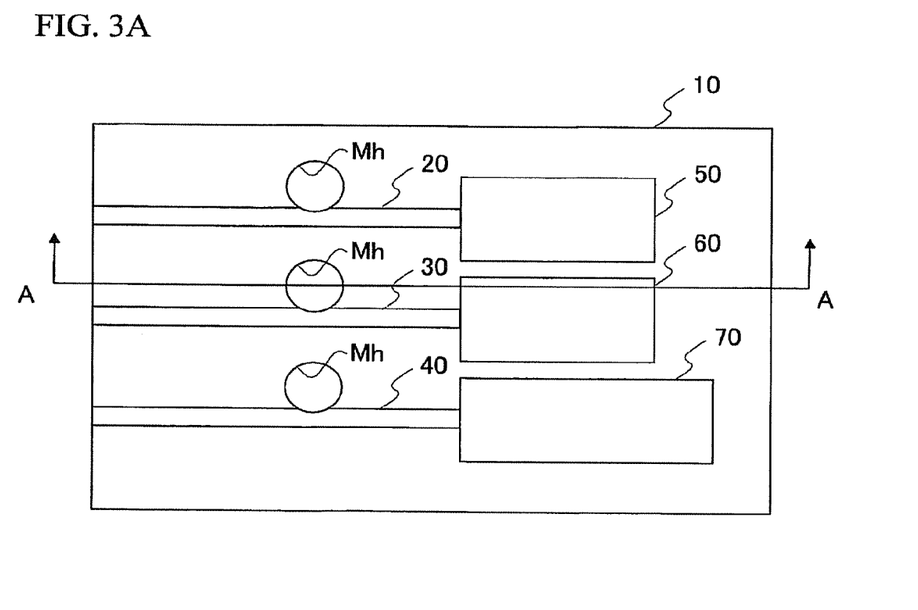
FIG. 3A is a top view illustrating a configuration of the printed circuit board in accordance with another exemplary embodiment of the present invention.
Figure 3B:
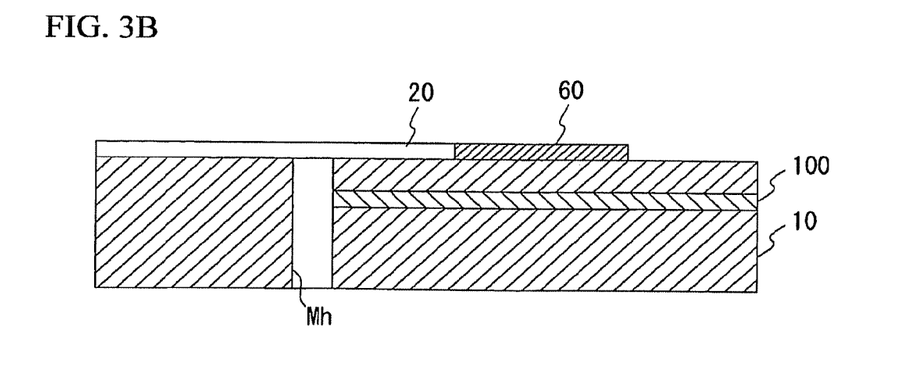
FIG. 3B is a cross-sectional view taken along a line A-A shown in FIG. 3A.
Figure 4A:
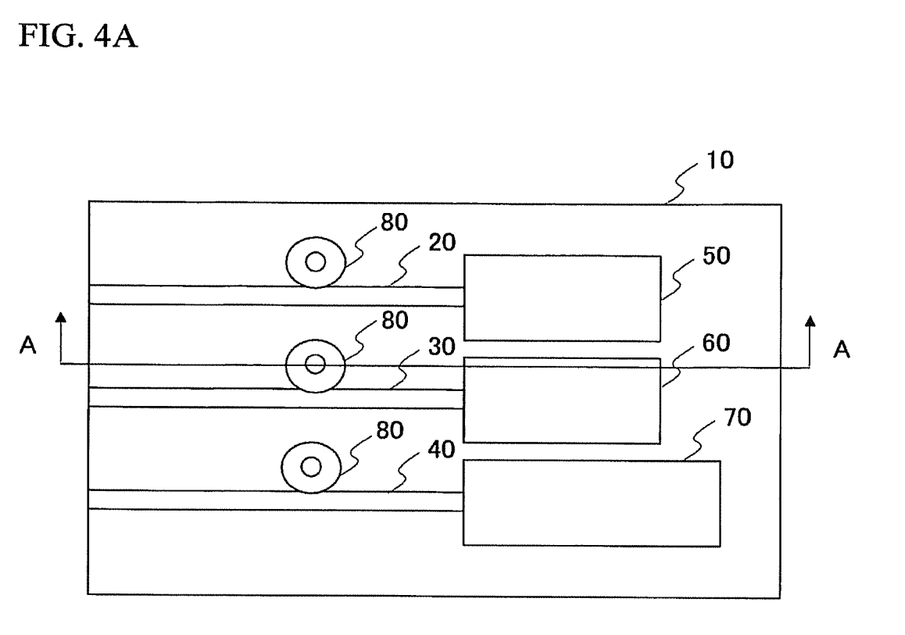
FIG. 4A is a top view showing a state before process openings are formed on the printed circuit board.
Figure 4B:
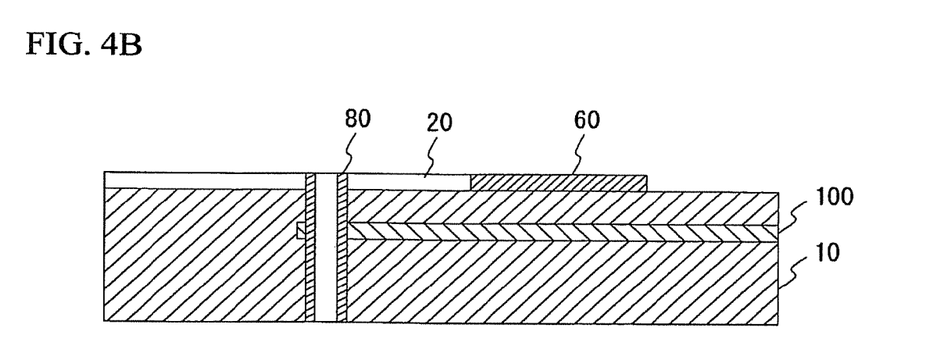
FIG. 4B is a cross-sectional view taken along a line A-A shown in FIG. 4A.

FIG. 3A through FIG. 4B show another exemplary embodiment in accordance with the present invention. FIG. 3A is a top view illustrating a configuration of the printed circuit board in accordance with another exemplary embodiment of the present invention. FIG. 3B is a cross-sectional view taken along a line A-A shown in FIG. 3A. FIG. 4A is a top view showing a state before process openings are formed on the printed circuit board. FIG. 4B is a cross-sectional view taken along a line A-A shown in FIG. 4A. Hereinafter, in FIG. 3A through FIG. 4B, the same components and configurations as those of the above-described exemplary embodiment have the same reference numerals.

The points of difference between the present embodiment and the above-described embodiment are now described. The via hole platings 80 are formed adjacently to the interconnections 20, 30, and 40, as shown in FIG. 4A and FIG. 4B, and then the connecting terminal-forming wirings 100 are respectively connected to the corresponding interconnections 20, 30, and 40, in accordance with the present embodiment. Subsequently, the process openings Mh that piece through the substrate 10 are formed in the positions that correspond to those for forming the via hole platings 80, so the connecting terminal-forming wirings 100 are electrically isolated from the interconnections 20, 30, and 40. Here, the positions and sizes for forming the via hole platings 80 and those of the process openings Mh are determined in consideration of the interconnections 20, 30, and 40, so that the interconnections 20, 30, and 40 have designed widths. According to the configuration employed in the present embodiment, the process openings Mh pierce through the substrate 10, thereby facilitating the process.

Figure 5A:
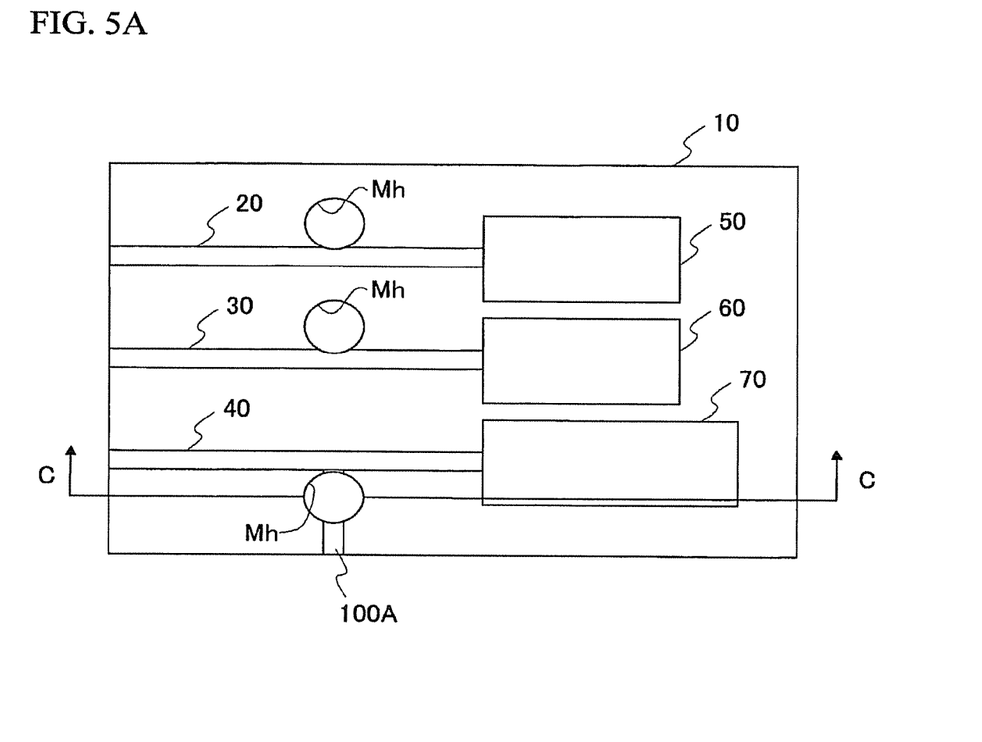
FIG. 5A is a top view illustrating a configuration of the printed circuit board in accordance with yet another exemplary embodiment of the present invention.
Figure 5B:
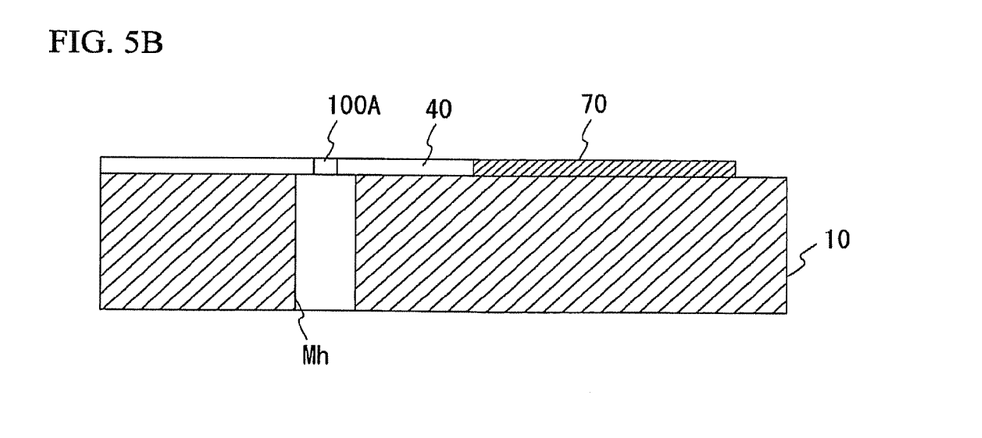
FIG. 5B is a cross-sectional view taken along a line C-C shown in FIG. 5A.
Figure 6:
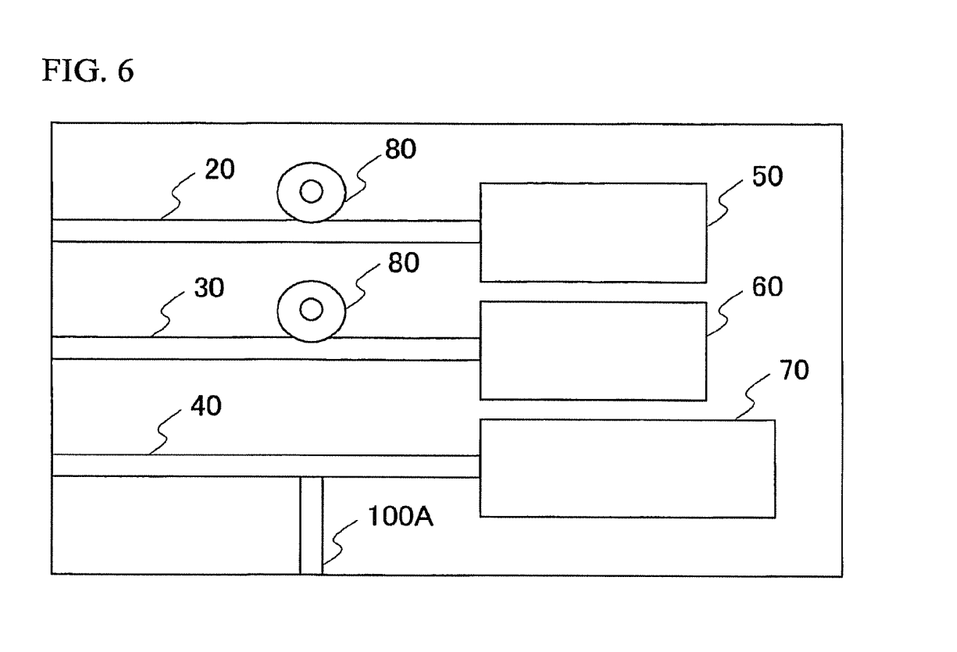
FIG. 6 is a top view showing a state before process openings are formed on the printed circuit board.

FIG. 5A, FIG. 5B, and FIG. 6 show yet another exemplary embodiment in accordance with the present invention. FIG. 5A is a top view illustrating a configuration of the printed circuit board in accordance with yet another exemplary embodiment of the present invention. FIG. 5B is a cross-sectional view taken along a line C-C shown in FIG. 5A. FIG. 6 is a top view showing a state before process openings are formed on the printed circuit board. Hereinafter, in FIG. 5A through FIG. 6, the same components and configurations as those of the above-described exemplary embodiments have the same reference numerals.

Figure 7:
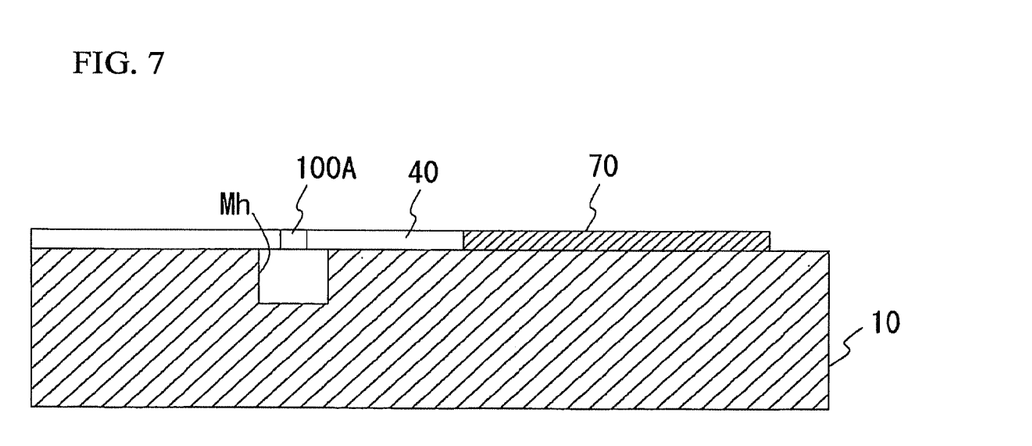
FIG. 7 is a variation example of the configuration of the printed circuit board shown in FIG. 5A and FIG. 5B.

In the present embodiment, the via hole plating 80 is not provided on the interconnection 40. Instead, as shown in FIG. 6, the interconnections 20, 30, and 40 are formed on the surface of the substrate 10, and a connecting terminal-forming wiring 100A is provided to be connected to the interconnection 40 on the surface of the substrate 10. In addition, as shown in FIG. 5A and FIG. 5B, the process openings Mh that extends through the substrate 10 are formed for the interconnections 20 and 30 in the positions that correspond to those for forming the via hole platings 80. The process opening Mh that extends through the substrate 10 is formed for the interconnection 40 in the position that corresponds to that for forming the via hole plating 80 to cut across the connecting terminal-forming wiring 100A. The positions and sizes of the process openings Mh are determined in consideration of the interconnections 20, 30, and 40, so that the interconnections 20, 30, and 40 may have designed widths. As stated, it is possible form the connecting terminal-forming wiring 100A at the same time in the process of forming the interconnections 20, 30, and 40, by arranging the connecting terminal-forming wiring 100A on the surface of the substrate 10. Also, the connecting terminal-forming wiring may be formed for the interconnection 20 or 30 on the surface of the substrate 10. In FIG. 6, the process opening Mh for the interconnection 40 is a through hole. However, referring now to FIG. 7, for example, the process opening Mh may be a blind hole that extends to a given depth in the substrate 10. This enables a lower layer of the process opening Mh to be utilized efficiently.

Figure 8A:
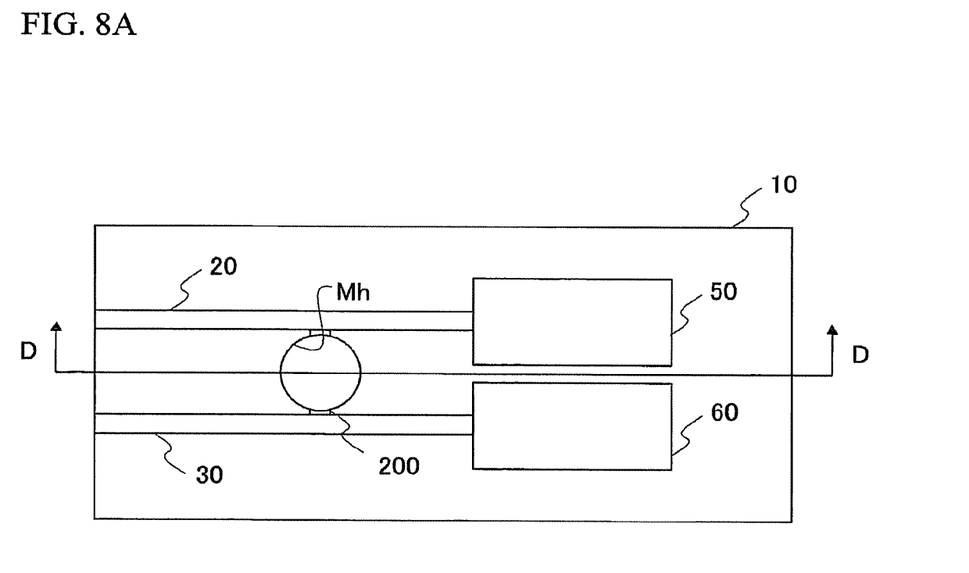
FIG. 8A is a top view illustrating a configuration of the printed circuit board in accordance with yet another exemplary embodiment of the present invention.
Figure 8B:
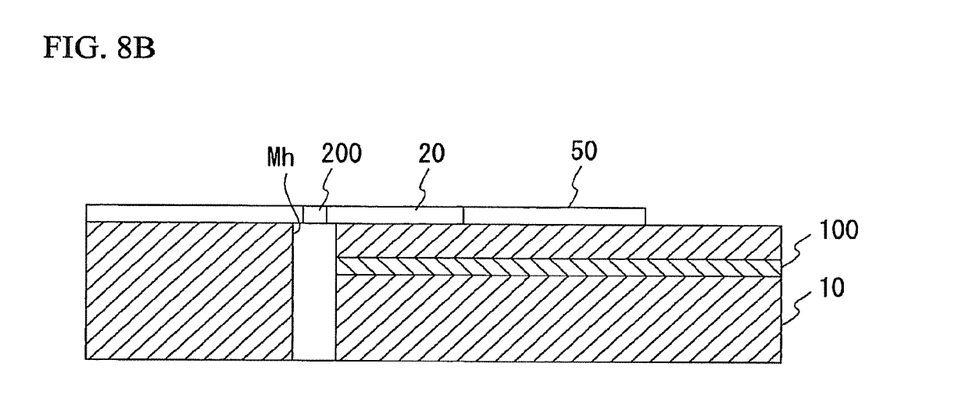
FIG. 8B is a cross-sectional view taken along a line D-D shown in FIG. 8A.
Figure 9A:
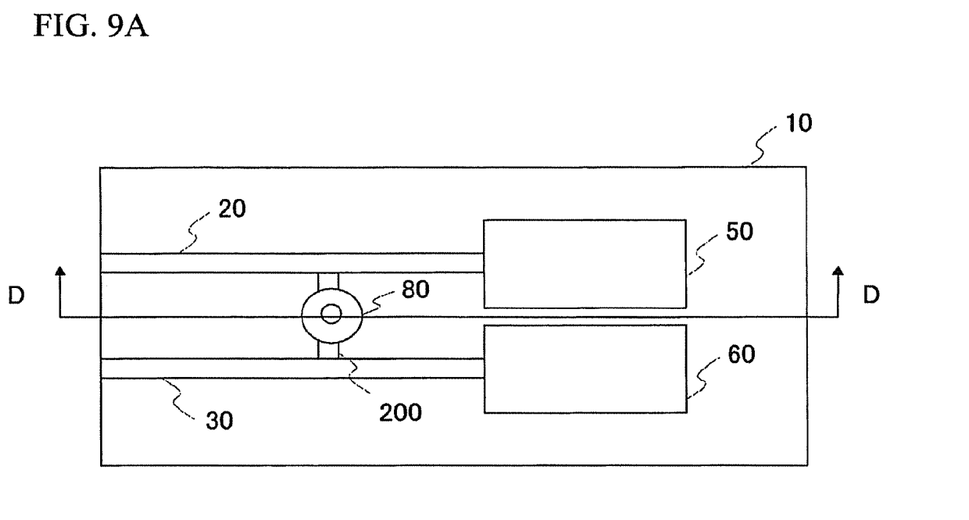
FIG. 9A is a top view showing a state before process openings are formed on the printed circuit board.
Figure 9B:
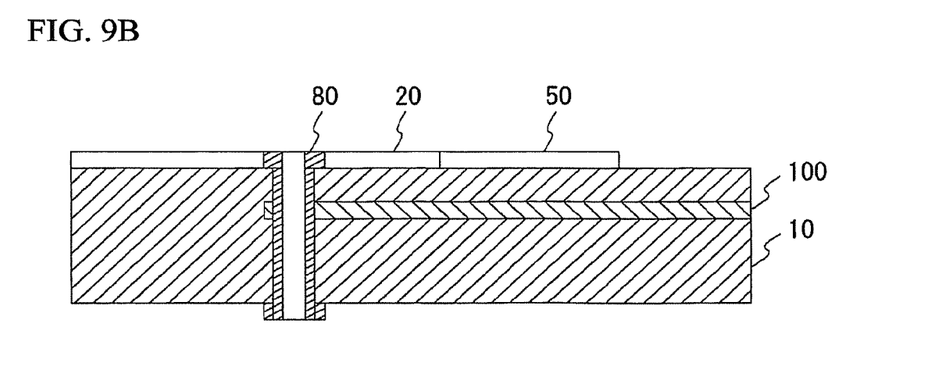
FIG. 9B is a cross-sectional view taken along a line D-D shown in FIG. 9A.

FIG. 8A through FIG. 9B show yet another exemplary embodiment in accordance with the present invention. FIG. 8A is a top view illustrating a configuration of the printed circuit board in accordance with another exemplary embodiment of the present invention. FIG. 8B is a cross-sectional view taken along a line D-D shown in FIG. 8A. FIG. 9A is a top view showing a state before process openings are formed on the printed circuit board. FIG. 9B is a cross-sectional view taken along a line D-D shown in FIG. 9A. Hereinafter, in FIG. 8A through FIG. 9B, the same components and configurations as those of the above-described exemplary embodiments have the same reference numerals.

On the surface of the substrate 10 employed in the present embodiment, referring to FIG. 9A and FIG. 9B, two interconnections 20 and 30 are arranged in parallel and the process opening Mh that pierces through the substrate 10 is arranged between the two interconnections 20 and 30. Referring to FIG. 8B, a connecting terminal-forming wiring 100 is provided as an inner layer of the substrate 10. The connecting terminal-forming wiring 100 is commonly provided to the two interconnections 20 and 30.

As shown in FIG. 9A and FIG. 9B, before the process opening Mh is formed on the printed circuit board, the connecting terminal-forming wiring 100 is formed as an inner layer of the substrate 10, the interconnections 20 and 30 are formed on the surface of the substrate 10, an interconnection 200 is formed on the surface of the substrate 10 to connect the interconnections 20 and 30, and the via hole plating 80 is formed between the interconnections 20 and 30 to connect the interconnection 200 and the connecting terminal-forming wiring 100. Subsequently, the via hole plating is formed in the position that corresponds to that for forming the via hole plating 80. The via hole plating 80 and the interconnection 200 are wholly or partially removed to electrically isolate the two interconnections 20 and 30 from the connecting terminal-forming wiring 100. Here, the position and size for forming the via hole plating 80 and those of the process openings Mh are determined in consideration of the interconnections 20 and 30, so that the interconnections 20 and 30 have designed widths.

It is thus possible to reduce the number of processed necessary for the process of the process opening Mh, by forming the via hole plating 80 and the connecting terminal-forming wiring 100 commonly provided for the interconnections 20 and 30 that transmit high-speed signals.

Figure 10A:
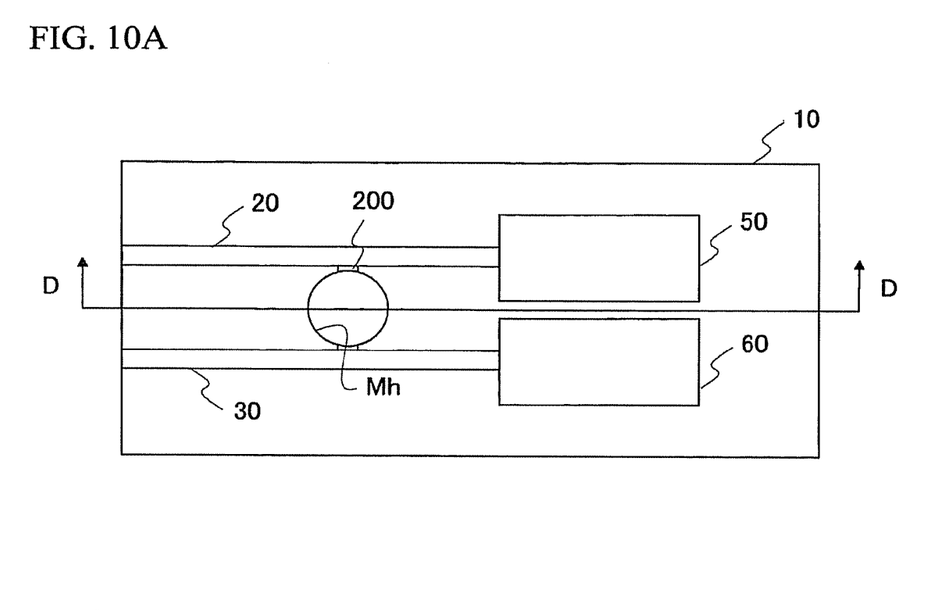
FIG. 10A and FIG. 10B show yet another exemplary embodiment in accordance with the present invention.
Figure 10B:
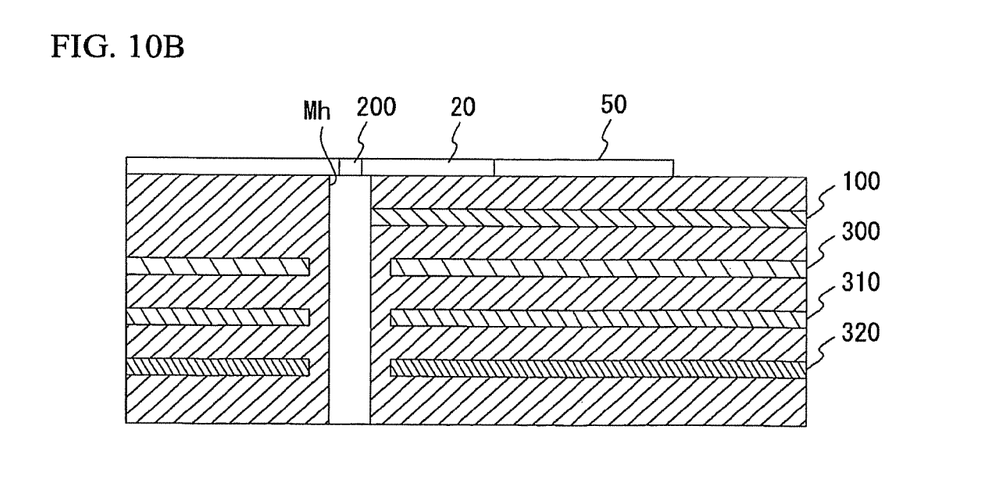
Figure 11A:
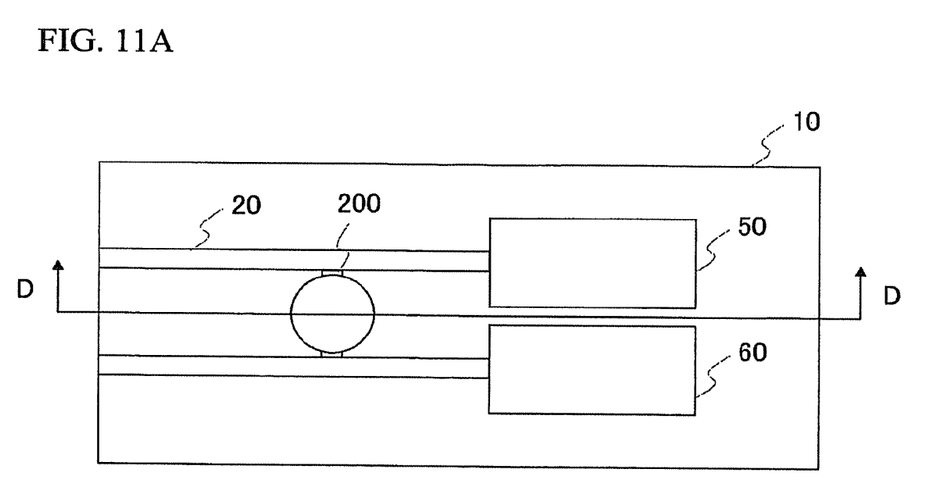
FIG. 11A and FIG. 11B show yet another exemplary embodiment in accordance with the present invention.
Figure 11B:
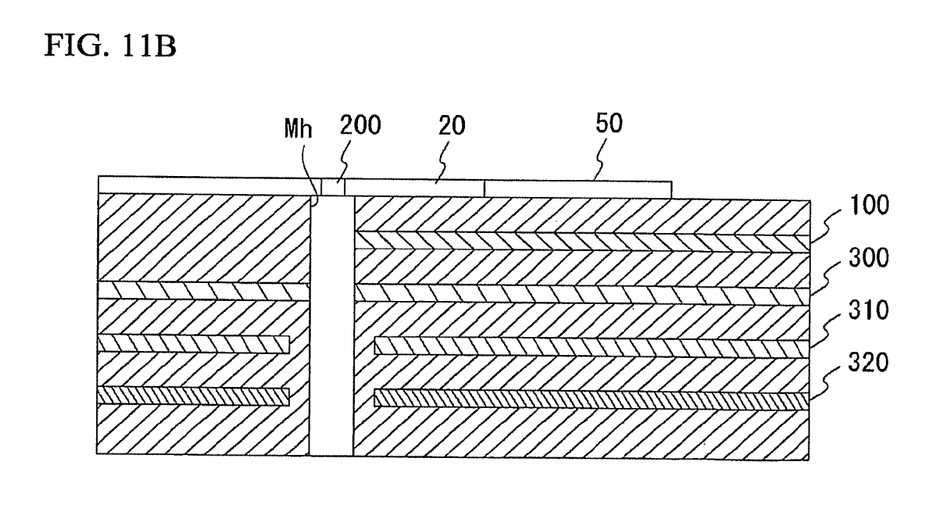

FIG. 10A and FIG. 10B show yet another exemplary embodiment in accordance with the present invention. Hereinafter, in FIG. 10A through FIG. 10B, the same components and configurations as those of the above-described exemplary embodiments have the same reference numerals. In this printed circuit board, the process opening Mh that pierces through the substrate is isolated from conductive layers composed of a wiring layer for ground 300, a wiring layer for power supply 310, and a wiring layer for signal 320. In other words, in accordance with the present embodiment, the conductive layers composed of the wiring layer for ground 300, the wiring layer for power supply 310, and the wiring layer for signal 320 are formed in the forming process so as to save regions where the process opening Mh pierces through. With the afore-described configuration, when the process opening Mh is processed with a drill, no drilled residue particles are generated from the respective conductive layers, thereby preventing the respective conductive layers being short-circuited. Referring now to FIG. 11A and FIG. 11B, for example, it may be configured such that only the wiring layer for ground 300 is in contact with the process opening Mh (which pierces through the substrate 10). There is no possibility of short-circuiting, if only one layer is in contact with the process opening Mh.

In the above-described embodiments, a description has been given of a case where a conductive via hole is formed by plating. However, the present invention is not limited to this case. The via hole may be formed by another method. In the above-described embodiments, the connecting terminals are formed by electrolytic gold plating. However, another type of electrolytic plating may be employed for forming the connecting terminals.

In the above-described embodiments, a description has been given of a case where the process openings are processed to electrically isolate all the interconnections 20, 30, and 40 from the connecting terminal-forming wirings 100. However, it may be configured such that the process openings are processed only for the interconnections 20 and 30 that transmit high-speed signals so as to electrically isolate from the connecting terminal-forming wiring.

According to one aspect of the present invention, there is provided a printed circuit board of a card edge connector type including: interconnections formed on a surface of a substrate to be electrically coupled to respective connecting terminals formed by electrolytic plating on an edge of the substrate; and connecting terminal-forming wirings being respectively in connection with the interconnections, when the connecting terminals are formed by the electrolytic plating. The interconnections are electrically isolated from the connecting terminal-forming wirings by process openings formed in the substrate.

In the above-described printed circuit board, the connecting terminal-forming wirings may be formed as inner layers of the substrate, and may be isolated from the interconnections by the process openings that extend to a given depth in the substrate. The above-described configuration eliminates the necessity of providing a through hole in the substrate, thereby making it possible to prevent the process opening formed in the substrate from affecting the conductive layers formed as inner layers in the substrate.

In the above-described printed circuit board, the connecting terminal-forming wirings may be formed apart from a card edge connector portion on the surface of the substrate, and may be electrically isolated from the interconnections by the process openings that pierce through the substrate. With the above-described configuration, it is possible to form the interconnections and the connecting terminal-forming wirings at the same time, thereby facilitating the formation of the connecting terminal-forming wirings.

In the above-described printed circuit board, the interconnections may include interconnections that transmit high-speed signals; and the process openings electrically isolate at least the interconnections that transmit the high-speed signals from the connecting terminal-forming wirings. With the above-described configuration, it is only necessary to form the process openings to isolate the connecting terminal-forming wirings from the signal lines that transmit high-speed signals that affect the circuit characteristics.

In the above-described printed circuit board, the process openings may be isolated from a conductive layer formed as an inner layer of the substrate. With the above-described configuration, it is possible to prevent the problem such as short-circuiting caused by the drilled residue particles.

In the above-described printed circuit board, the process openings may be in contact with only one layer out of multiple conductive layers formed as inner layers. With the above-described configuration, it is possible to process a layer having a large area such as a ground layer and to prevent the problem such as the short-circuiting caused by the drilled residue particles, when only one layer is in contact with the process opening.

In the above-described printed circuit board, via holes may be formed to respectively connect the interconnections and the connecting terminal-forming wirings. With the above-described configuration, it is possible to connect the interconnections formed on the surface of the substrate and the connecting terminal-forming wirings formed as inner layers by the via holes, and the processing can be facilitated by forming the process openings in the position that correspond to those for forming the via holes.

In the above-described printed circuit board, the electrolytic plating may include electrolytic gold plating. With the above-described configuration, it is possible to form the connecting terminals with the use of highly conductive gold plating and to retain the thickness of the connecting terminals sufficiently as compared to those with the use of nonelectrolytic plating.

According to an exemplary embodiment of the present invention, it is possible to eliminate the influence on the circuit characteristics of the connecting terminal-forming wiring connected to the signal line or the like so as to form the connecting terminals on the printer circuit board of the card edge connector type by electrolytic plating.

The present invention is not limited to the above-mentioned embodiments, and other embodiments, variations and modifications may be made without departing from the scope of the present invention.

The present invention is based on Japanese Patent Application No. 2005-212427 filed on Jul. 22, 2005, the entire disclosure of which is hereby incorporated by reference.

What is claimed is:

1. A printed circuit board of a card edge connector type comprising:
   interconnections formed on a surface of a substrate electrically coupled to respective connecting terminals formed by electrolytic plating on an edge of the substrate; and
   connecting terminal-forming wirings being respectively in connection with the interconnections, when the connecting terminals are formed by the electrolytic plating,
   wherein the interconnections are electrically isolated from the connecting terminal-forming wirings by process openings formed in the substrate,
   wherein the connecting terminals include a first connecting terminal connected to a first interconnection transmitting a high-speed signal and a second connecting terminal connected to any one of a power supply, a ground, and a second interconnection transmitting a low-speed signal, and a length of the first connecting terminal is different from a length of the second connecting terminal.

2. The printed circuit board as claimed in claim 1, wherein the connecting terminal-forming wirings are formed as inner layers of the substrate, and are isolated from the interconnections by the process openings that extend to a given depth in the substrate.

3. The printed circuit board as claimed in claim 1, wherein the connecting terminal-forming wirings are formed apart from a card edge connector portion on the surface of the substrate, and are electrically isolated from the interconnections by the process openings that pierce through the substrate.

4. The printed circuit board as claimed in claim 1,
   wherein:
   the interconnections include interconnections that transmit high-speed signals; and
   the process openings electrically isolate at least the interconnections that transmit the high-speed signals from the connecting terminal-forming wirings.

5. The printed circuit board as claimed in claim 1, wherein the process openings are isolated from a conductive layer formed as an inner layer of the substrate.

6. The printed circuit board as claimed in claim 5, wherein the process openings are in contact with only one layer out of multiple conductive layers formed as inner layers.

7. The printed circuit board as claimed in claim 1, wherein via holes are formed to respectively connect the interconnections and the connecting terminal-forming wirings.

8. The printed circuit board as claimed in claim 1, wherein the electrolytic plating includes electrolytic gold plating.

9. The printed circuit board as claimed in claim 1, wherein the length of the first connecting terminal is shorter than the length of the second connecting terminal.

10. The printed circuit board as claimed in claim 1, wherein a distance between the edge of the substrate and the second connecting terminal is shorter than a distance between the edge of the substrate and the first connecting terminal.

* * * * *